United States Patent [19]

Kabeshita et al.

[11] Patent Number: 5,080,036
[45] Date of Patent: Jan. 14, 1992

[54] THICK FILM DRAWING APPARATUS

[75] Inventors: Akira Kabeshita; Kazuhiro Mori, both of Katano, Japan

[73] Assignee: Matsushita Electric Industrial Co., Ltd., Kadoma, Japan

[21] Appl. No.: 498,452

[22] Filed: Mar. 20, 1990

Related U.S. Application Data

[63] Continuation of Ser. No. 328,762, Mar. 27, 1989, abandoned, which is a continuation of Ser. No. 65,527, Jun. 23, 1987, abandoned.

[51] Int. Cl.$^5$ .................... B05C 5/00; B05C 13/00
[52] U.S. Cl. .................... 118/415; 118/410; 118/421; 118/428; 118/503; 118/697
[58] Field of Search ............ 118/410, 503, 696, 697, 118/415, 421, 428

[56] References Cited

U.S. PATENT DOCUMENTS

| | | | |
|---|---|---|---|
| 4,592,303 | 6/1986 | Wilbur, Jr. | 118/503 |
| 4,605,569 | 8/1986 | Shimada et al. | 118/697 |
| 4,692,351 | 9/1987 | Maeda et al. | 118/410 |
| 4,743,465 | 5/1988 | Saeki et al. | 118/411 |
| 4,770,120 | 9/1988 | Komatsu | 118/697 |

*Primary Examiner*—James C. Housel
*Attorney, Agent, or Firm*—Cushman, Darby & Cushman

[57] ABSTRACT

A thick film drawing apparatus includes a substrate holding member (50) for holding a substrate (a), moving coils (60) for holding the substrate holding member (50), a drawing head (20) having a nozzle (30) and a stylus (33) for emitting pastes for drawing on a surface of the substrate (a) moving thereon and pushing the substrate (a) downward, respectively, wherein in the drawing process the drawing head (20) is locked of up/down motions and the substrate holding member (50) is raised/lowered at substantially constant weaker force by the moving coils (60), and thereby a relative-moving response of the up/down directions of the nozzle (30) is improved and a contact force of the stylus (33) on the substrate (a) is kept under a predetermined constant value, therefore a thickness of thick film line (c) is kept uniform and circuit patterns are prevented from being flawed.

4 Claims, 8 Drawing Sheets

THICK FILM DRAWING APPARATUS

This is a continuation of application Ser. No. 07/328,762, filed Mar. 27, 1989, which was abandoned upon the filling hereof, and which was a continuation of 07/065,527 filed June 23, 1987, now abandoned.

FIELD OF THE INVENTION AND RELATED ART STATEMENT

1. Field of the Invention

The present invention relates to a thick film drawing apparatus, and more particularly to a thick film drawing apparatus which emits pastes from a nozzle of a drawing head, thereby to draw thick film lines on a surface of a substrate.

2. Description of the Related Art

An example of the conventional thick film drawing apparatus is shown in FIG. 12. As shown in this figure, a substrate "a" is put on a holder 1 and is held tightly by vacuum pressures through holes 2 of the holder 1 which is connected to a suction pump. A drawing head 3 contains a swing lever 4 which holds a nozzle 5 at an end thereof. Pastes b stored in a reservoir connected to the nozzle 5 are pressurized by a suitable means, for instance a compressed air through a hose 6, and thereby pastes b are emitted from the nozzle 5 onto the substrate "a".

Thick film lines c for wiring are drawn by moving the drawing head 3 in horizontal direction relatively to the substrate "a", particularly in this conventional example by moving an X-Y table 10 on which the holder 1 is fixed. Then, a stylus 7 which is made of a diamond and is fixed at an end of the nozzle 5 pushes the substrate "a", so that a gap between an exit 8 of the nozzle 5 and the substrate "a" is kept constant. Relation of strength of a coil spring 9 and a weight of the nozzle 5 and a weight of the swing lever 4 are selected so as to make a balance around a fulcrum 4a, thereby to push the substrate "a" with a suitable force. Therefore, when a surface of the substrate "a" has some warps thereon, the nozzle 5 moves up and down to follow the warps, thereby to draw smoothly and to lower a contact force of the stylus 7 which pushes the substrate "a".

The swing lever 4 can be rotated clockwise in the figure at exciting of a solenoid 11 for the time of non-drawing, thereby to raise the nozzle 5.

In the above-mentioned conventional thick film drawing apparatus, there are the following shortcomings.

(i) Masses of movable members, namely the nozzle 5 and the swing lever 4, are rather large. Especially, the mass of the nozzle 5 inevitably becomes large since the nozzle 5 is generally required to provide a temperature control device thereon for keeping a temperature of pastes b constant and the nozzle 5 is sometimes provided with a rotation device for rotating it around its vertical axis. Therefore, the swinging part consisting of these movable members and the coil spring 9 has a large inertia, and thereby a moving response of the nozzle 5 against unevenesses of the substrate "a" at high speed drawing becomes worse, hence making it difficult to keep the thickness of a thick film line c uniform.

(ii) If the coil spring 9 is strengthened, hence to strengthen the contact pressure, in order to resolve the shortcomings mentioned above, circuit patterns on the substrate "a" is liable to be flawed by the stylus 7.

(iii) The coil spring 9 necessarily changes stresses responding to its transformations. Therefore, the contact force of the stylus 7 to the substrate "a" changes responding to the warps of the substrate "a". Therefore, it is not easy to keep the thickness of the thick film line c uniform nor to keep the contact force under a predetermined value so as not to flaw the circuit pattern.

OBJECT AND SUMMARY OF THE INVENTION

Therefore, the object of the present invention is to provide such an improved thick film drawing apparatus which can resolve the above-mentioned problems of the conventional thick film drawing apparatus.

In order to achieve the above-mentioned object, the thick film drawing apparatus in accordance with the present invention comprises:

a holding means for holding at least one substrate thereon movable in up and down directions, raising means for raising the holding means with substantially constant force, a drawing head having a nozzle and a pushing member for emitting pastes for drawing on a surface of the substrate moving thereon and pushing the substrate downward, respectively, and a locking means for locking said drawing head of up and down motions in the drawing process.

By adopting the above-mentioned construction, the following advantages are presented.

(1) An inertia of the swinging part consisting of the substrate and the substrate holding means and the raising means of the substrate holding means is small since the masses of the substrate and the substrate holding means can be smaller than that of the movable part of the drawing head. Therefore, the relative-moving response of the up and down directions of the nozzle to the unevenesses of the substrate during the drawing is improved. Further, a raising force which raises the substrate holding means can be lowered, for instance, to below 100 g.

(2) Since the substrate holding means is raised with substantially constant force, the contact force of the pushing member to the substrate can be kept constant and under the predetermined value.

The above-mentioned advantages (1) or (2) resolves the aforementioned problems (i) and (ii) or (iii), respectively. That is, a thickness of a thick film line is kept uniform and circuit patterns are prevented from flawing.

DESCRIPTION OF THE PREFERRED EMBODIMENT

A preferred embodiment of the present invention is shown in FIGS. 1 to 11.

These figures concern a thick film drawing apparatus which emits resistor pastes and conductor pastes onto a substrate of electronic circuits, thereby to form resistors or lead wires.

Figure 2:
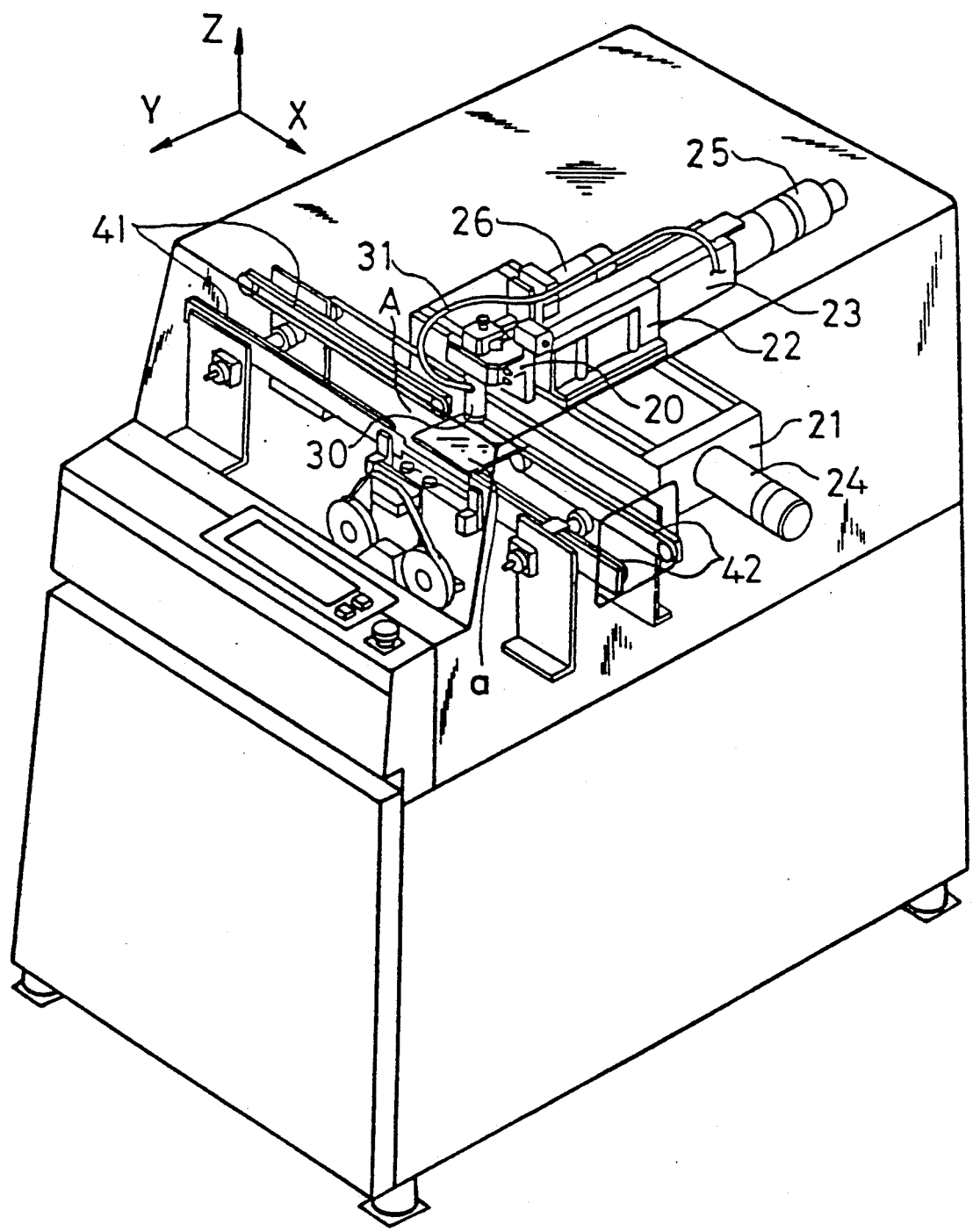
FIG. 2 is a perspective view showing the embodiment of a thick film drawing apparatus in accordance with the present invention.

FIG. 2 shows a whole appearance of the present invention. A drawing head 20 is held movably in two directions shown by arrows X and Y as a horizontal surface. That is, an X-direction movable member 22 is held on an X-direction guide member 21, a Y-direction movable member 23 is held on the X-direction movable member 22 and a drawing head 20 is held at an end of the Y-direction movable member 23. The X-direction movable member 22 is driven in X-direction by an X-direction driving motor 24, and the Y-direction movable member 23 is driven in Y-direction by a Y-direction driving motor 25, thereby enabling movements of the drawing head 20 onto any point of X-Y coordinates. The drawing head 20 is held movably in up and down directions, and is driven up and down by a Z-direction driving motor 26. While drawing, the drawing head 20 is lowered to a drawing position level and is locked of the level in the Z-direction by stopping the Z-direction driving motor 26 for drawing. When a substrate "a" is carried out of a working area A and another substrate "a" is carried into the working area A, the drawing head 20 is raised to an upper home position so as to carry in/out the substrate smoothly.

A drawing nozzle 30 storing pastes therein is fixed to the drawing head 20. Although not shown in FIG. 2, several drawing nozzles 30 are often fixed to the drawing head so as to exchange to use them properly. Pastes stored in the nozzle 30 are pressurized by, for instance, a compressive air through a hose 31, thereby to give pastes a constant emitting pressure. Although not shown in the figure, the nozzle 30 equips a temperature control device thereon for keeping a temperature, hence viscosity, of the pastes constant and a rotating device thereon for rotating the drawing nozzle 30 around its vertical axis. Therefore, a mass of the drawing nozzle 30 becomes rather large.

A stylus 33 (FIG. 1) which is made of a diamond is fixed nearly to an emitting exit of the drawing nozzle 30 and pushes the substrate "a" with a predetermined force. A length in vertical direction of the stylus 33 is set about 40 μm in order to keep a gap between the emitting exit 32 and the substrate "a" at about 40 μm.

Figure 3:
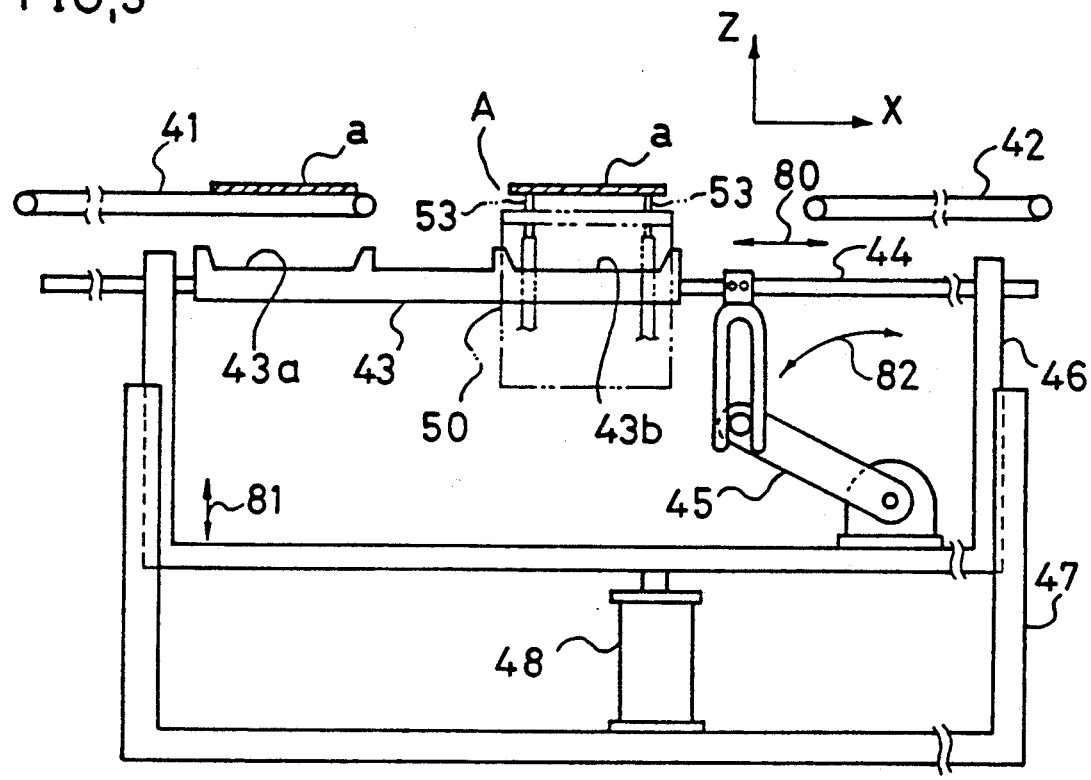
FIG. 3 is a cross-sectional view showing transfer members for a substrate of the embodiment of a thick film drawing apparatus in accordance with the present invention.
Figure 4:
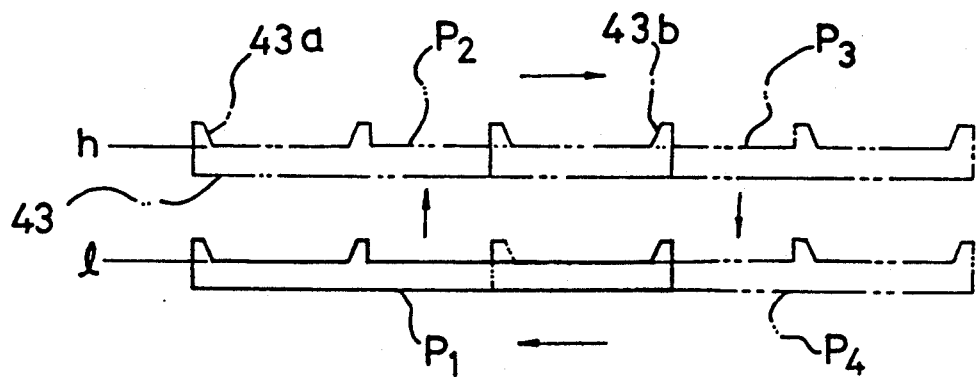
FIG. 4 is a schematic illustration showing a transferring manner of a carriage of the embodiment of a thick film drawing apparatus in accordance with the present invention.

Transfer members for the substrate "a" are shown in FIG. 3. The substrate "a" is transferred from a loading belt 41 onto a substrate holding member 50 in the working area A by a transfer mechanism shown in the figure. After completion of a drawing, the substrate "a" is transferred from the substrate holding member 50 onto an unloading belt 42 by the transfer mechanism. A carriage 43 has a pair of pallets 43a and 43b. A guide lever 44 which is fixed to the carriage 43 is driven by a swinging arm member 45 which swings in a direction shown by an arrow 82, to a direction (X) shown by an arrow 80. A stand 46 which holds the guide lever 44 and puts the swinging arm member 45 thereon is held movably to a direction (Z) shown by an arrow 81 by an air cylinder 48. A frame 47 holds the stand 46 and puts the air cylinder thereon. As shown in FIG. 4, the carriage 43 moves in order, that is, from $P_1$ to $P_4$ and to $P_1$ again.

Figure 1:
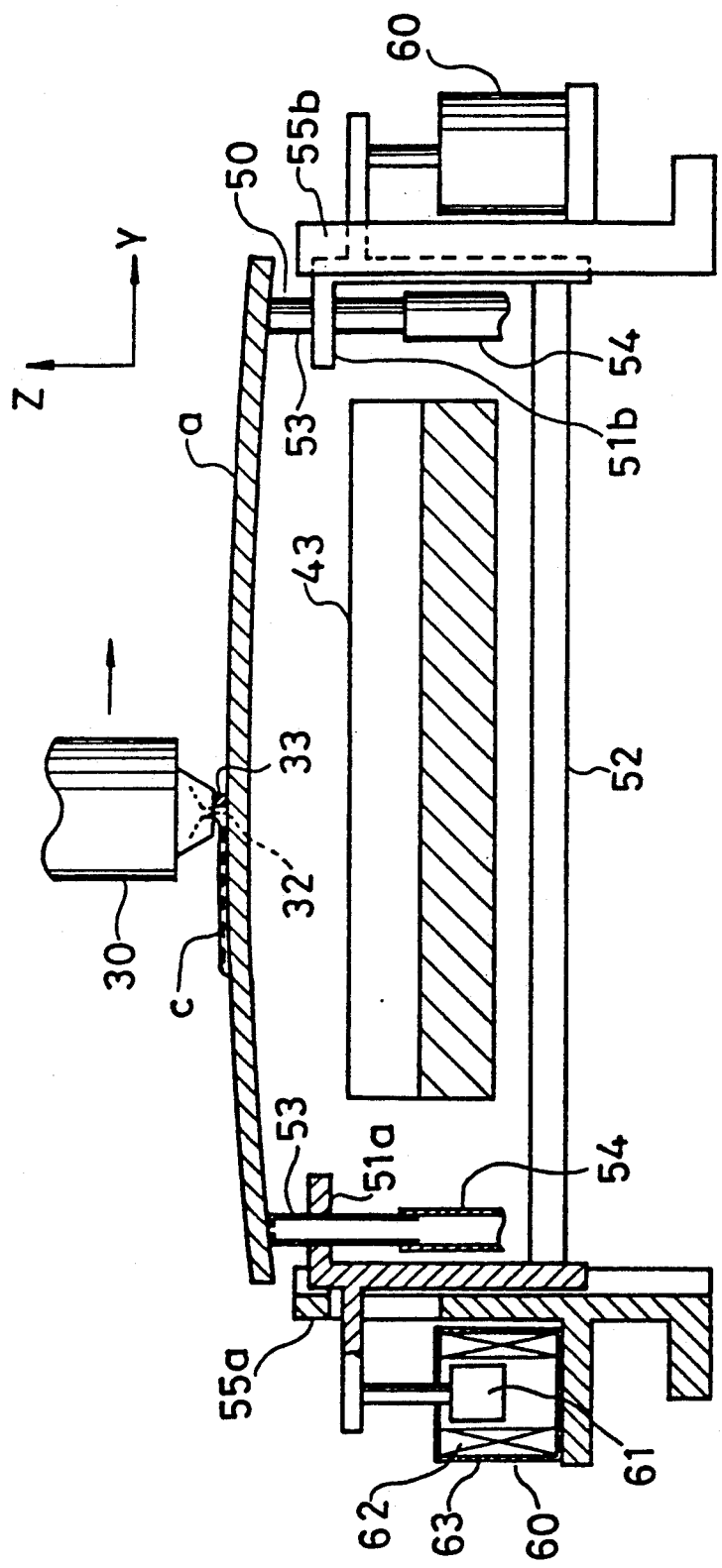
FIG. 1 is a cross-sectional view showing holding means of an embodiment of a thick film drawing apparatus in accordance with the present invention.
Figure 10:
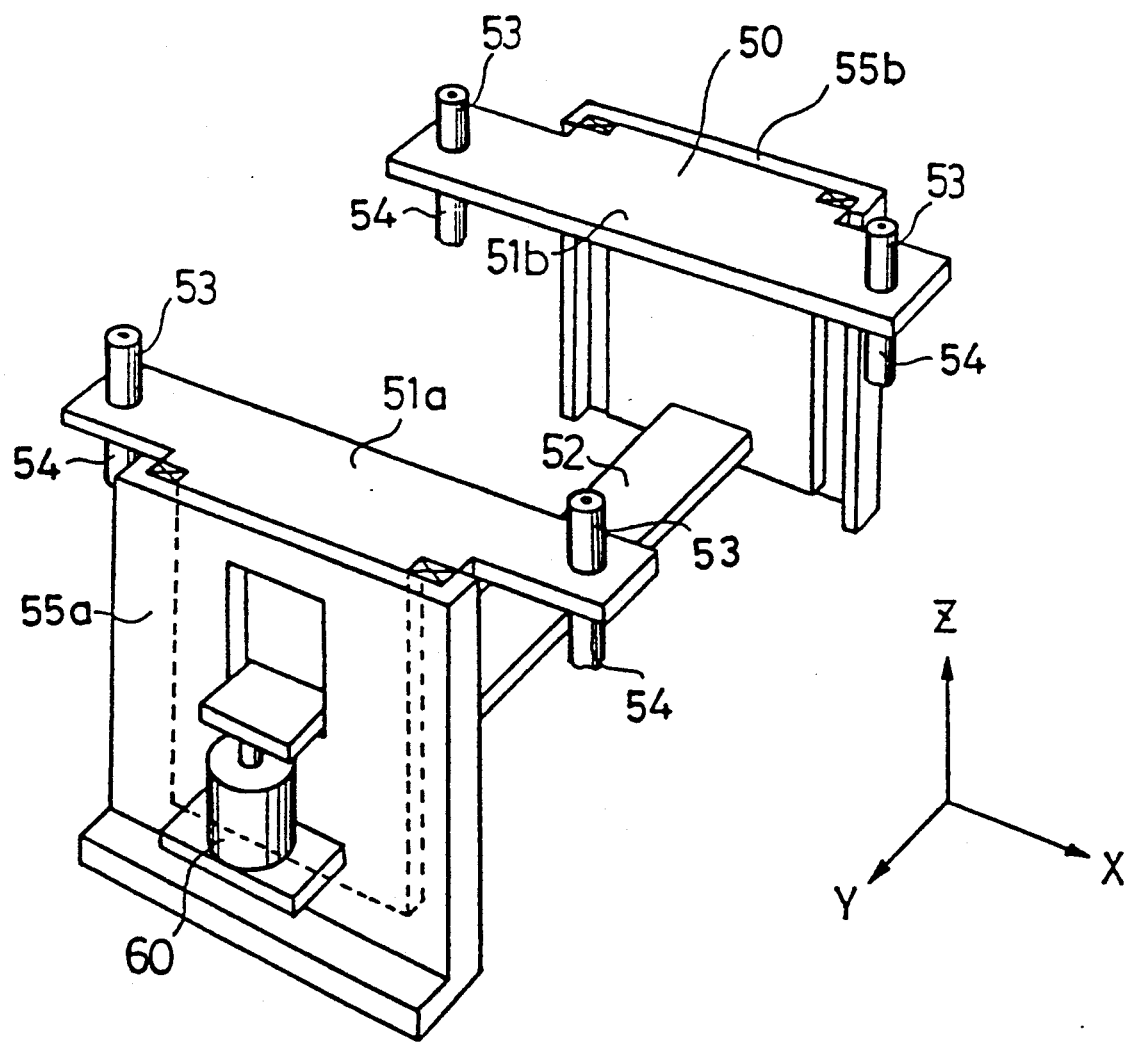
FIG. 10 is a perspective view showing the holding means of the embodiment of a thick film drawing apparatus in accordance with the present invention.

As shown in FIGS. 1 and 10, the substrate holding member 50 consists of a right and left pair of up and down plates 51a and 51b, a connecting plate 52 which connects the up and down plates 51a and 51b, and suction nozzles 53 which are disposed on four corners of the up and down plates 51a and 51b. Hoses 54 are connected to the suction nozzles 53, therefrom vacuum pressure are operated. Four corners of the substrate "a" are sucked by four suction nozzles 53.

The substrate holding member 50 is held movably to up and down directions (Z) by supporting walls 55a and 55b which guide the up and down plates 51a and 51b respectively. The substrate holding member 50 is raised/lowered by a pair of moving coils 60 which are fixed on projections of the supporting walls 55a and 55b and push projections of the up and down plates 51a and 51b. Further, while drawing, the substrate holding member 50 is raised with substantially constant force by means of the moving coils 60.

As shown in FIG. 1, the moving coil 60 consists of a moving pole 61 having a permanent magnet, a stator 62 having electromagnetic coil and a case 63. When the stator 62 is excited, the moving pole 61 is raised by an electromagnetic force. Exciting current is variable to stronger one or to weaker one, and thereby the substrate holding member 50 is raised with stronger or weaker force by the moving pole 61. When the excitation of the moving coil 60 is turned off, the electromagnetic force is extinguished, and thereby the substrate holding member 50 is lowered to its lowest point.

Figure 11:
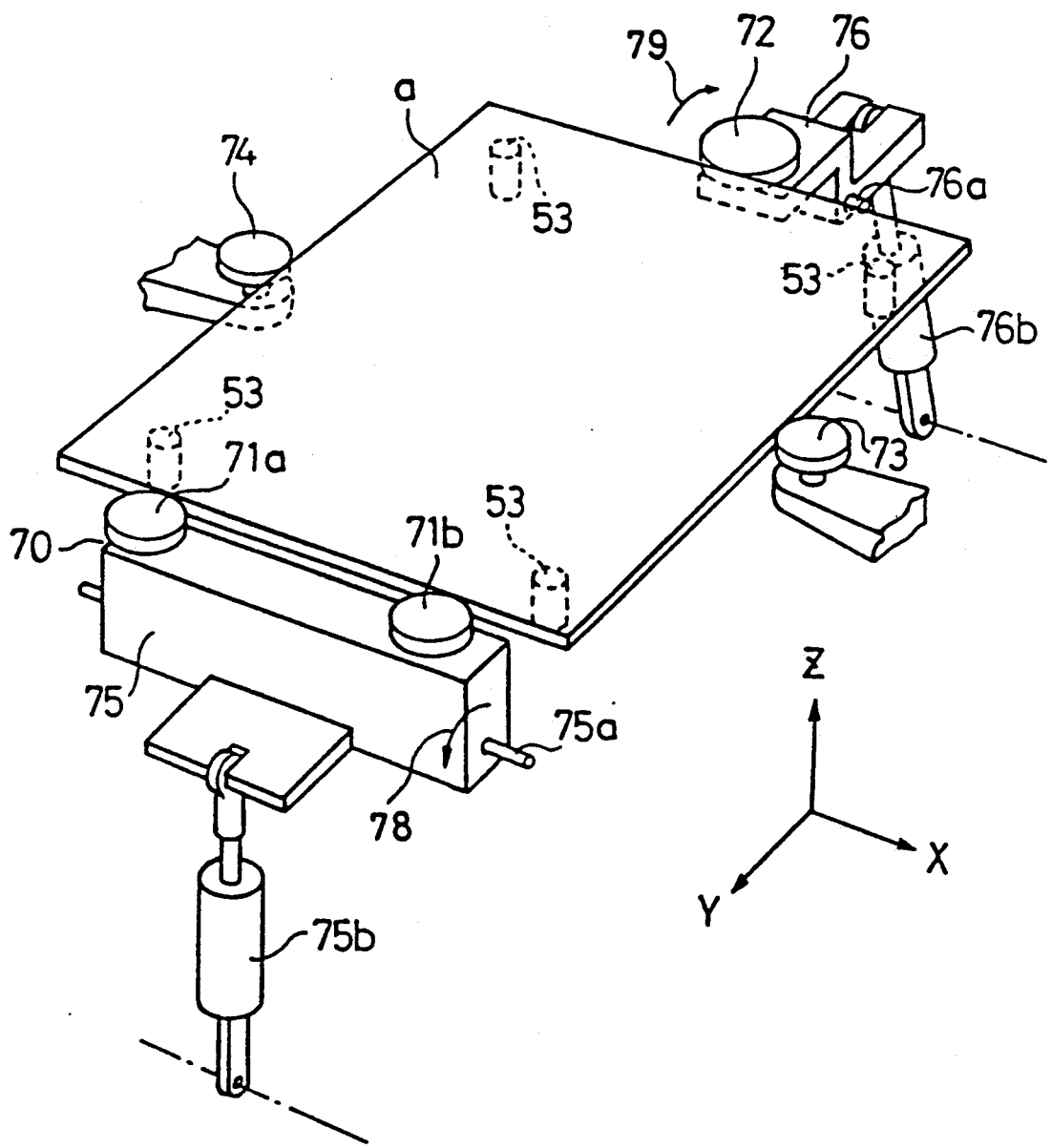
FIG. 11 is a perspective view showing a location aid device of the embodiment of a thick film drawing apparatus in accordance with the present invention.
Figure 12:
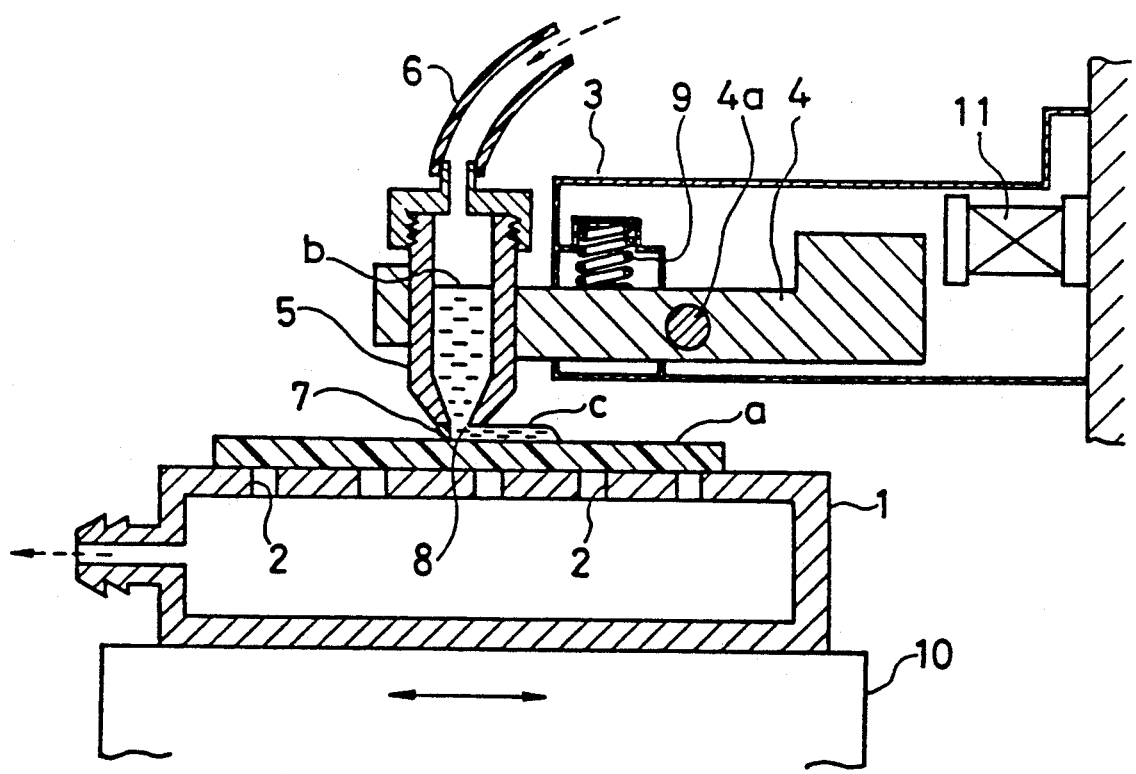
FIG. 12 is the cross-sectional view showing the conventional thick film drawing apparatus.

As shown in FIG. 3, after a substrate "a" is transferred from the loader belt 41 to the substrate holding member 50 by the transfer mechanism, the substrate "a" is located into a correct position of horizontal direction by means of a location aid device 70 shown in FIG. 11.

The location of the substrate "a" is adjusted by pushing its peripheries by adjusting rollers so as to locate the substrate "a" into a correct position in the X and Y directions. In the Y-direction, adjusting rollers 71a and 71b push the substrate "a" with a stronger force than an adjusting roller 72 so as to hold the substrate "a" stable, and thereby to guide the substrate "a" into the correct position. Similarly in the X-direction, an adjusting roller 73 push the substrate "a" with a stronger force than an adjusting roller 74. Then, peripheries of the substrate "a" are sucked by the suction nozzles 53. Holding members 75 and 76 which hold the adjusting rollers 71a and 71b and the adjusting roller 72 respectively in the Y-direction are held rotatably around shafts 75a and 76a and are driven by air cylinders 75b and 76b, respectively. When the location is completed, the holding member 75 and 76 are rotated to directions shown by arrows 78 and 79, respectively, so as to release and keep off the substrate "a", thereby not to prevent its carrying in/out. The adjusting rollers 73 and 74 in the X-direction operate similarly to the above-mentioned in the Y-direction.

Figure 5:
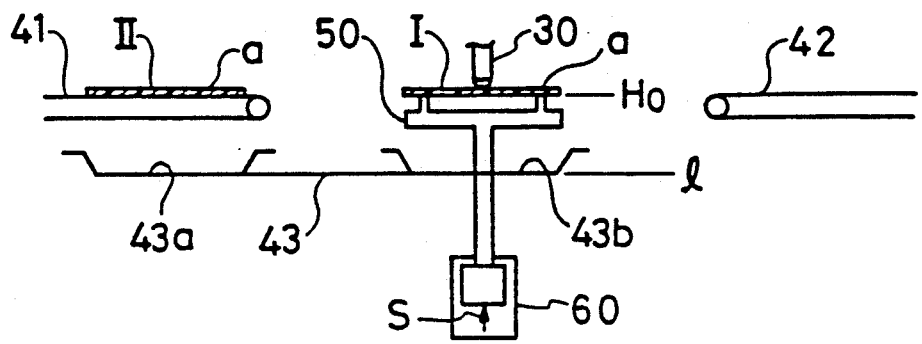
FIGS. 5 to 9 are schematic illustrations showing movements of substrates, the carriage and the holding means, of the embodiment of a thick film drawing apparatus in accordance with the present invention.

FIGS. 1 and 5 show a drawing process. In FIG. 1, the substrate "a" is held by four suction nozzles 53. In FIG. 1 the substrate "a" is shown as slightly warped, which is exaggeratedly shown in FIG. 1. The stylus 33 which is fixed at the end of the drawing nozzle 30 pushes a surface of the substrate "a". While drawing, the drawing nozzle 30 is locked of up and down motions. Therefore, height differences related to the warp of the substrate "a" is compensated for up and down motions of the substrate holding member 50. Thick film lines c are drawn by emitting pastes from the drawing nozzle 30 which moves relatively to the substrate "a".

The substrate holding member 50 is raised by the electromagnetic force of the moving coils 60. Apart from a coil spring holder, the raising force is always kept constant at any raised levels of the substrate holding member 50. A force S shown in FIG. 5 is set lower in comparison with a force which is given at the time of location as will be mentioned later. For instance, the substrate "a" is touched to the stylus 33 of the drawing nozzle 30 with such a weak force of 80 to 100 g so as not to flaw circuit patterns of the substrate "a" by the stylus 33.

Figure 8:
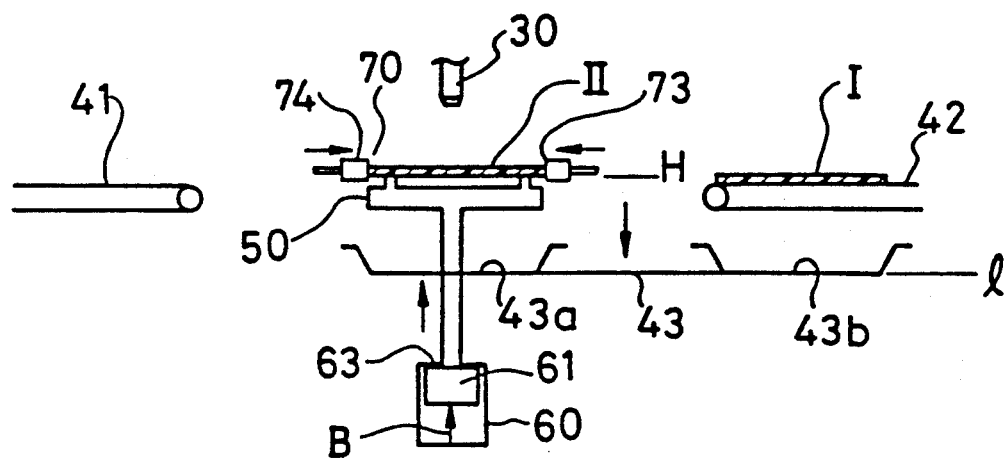
Figure 9:
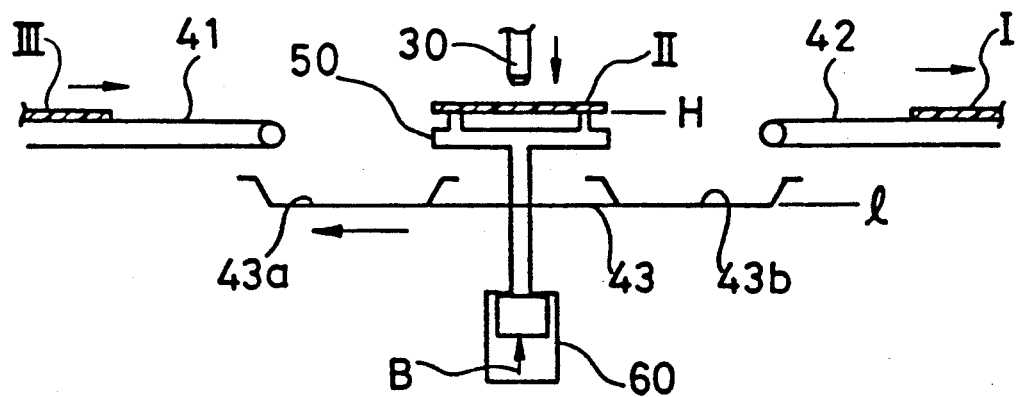

Next, sequential transfer operations of the thick film drawing apparatus will be specified. In FIG. 5, a first substrate I is held by the substrate holding member 50 and is in the drawing process. A second substrate II is waiting on the loader belt 41. The substrate holding member 50 is lowered by the drawing nozzle 30 (stylus 33) to a level Ho, which is lower slightly than the highest level H (FIGS. 8 and 9). Then, the substrate holding member 50 is raised with a weak force S by the moving coil 60. The pallets 43a and 43b on the carriage 43 are located respectively under the substrates I and II. This location of the carriage 43 corresponds to $P_1$ as shown in FIG. 4.

Figure 6:
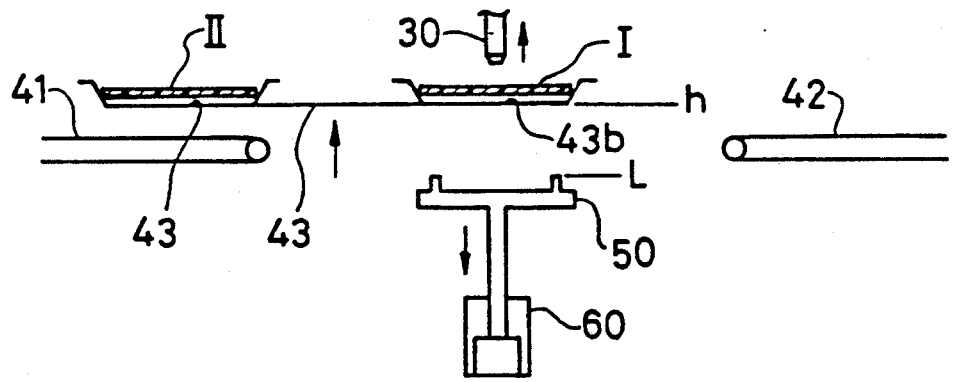

After completion of the drawing, the drawing nozzle 30 removes upward and the substrate holding member 50 is lowered to the lowest level L as shown in FIG. 6. At the same time the carriage 43 is raised from a low level l of FIG. 5 to a high level h of FIG. 6, wherein the high level thereof corresponds to $P_2$ shown in FIG. 4. And then, the substrate I on the substrate holding member 50 and the substrate II on the loader belt 41 are caught and raised by two pallets 43b and 43a of the carriage 43 respectively.

Figure 7:
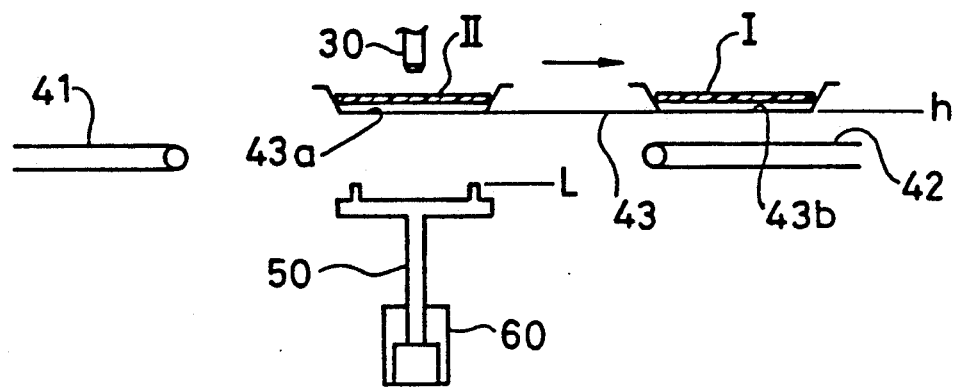

Next, when the carriage 43 advances rightwards as shown in FIG. 7 with its level in the high level h, the substrate I is transferred to a position above the unloader belt 42 and the substrate II is transferred above the substrate holding member 50 respectively. This location of the carriage 43 corresponds to $P_3$ shown in FIG. 4.

Next, the carriage 43 is lowered to the low level l as shown in FIG. 8. The location of the carriage 43 corresponds to $P_4$ as shown in FIG. 4. At the same time, the moving pole 61 of the moving coil 60 is raised by the electromagnetic force until it reaches the top end of the case 63, and thereby the substrate holding member 50 is raised to the highest level H.

By the above-mentioned sequential operations, the substrate I is transferred onto the unloader belt 42, and the substrate II is transferred onto the substrate holding member 50. And then, the substrate II is adjusted of location in the horizontal direction by the rollers of the location aid device 70 as shown in FIG. 8, wherein only the adjusting rollers 73 and 74 in the X-direction are shown. During the location adjustment, the substrate II is raised with the stronger force B by the moving coil 60 so as to keep a stability of the substrate "a".

After completion of the location for the substrate II, all the rollers remove away, and the carriage 43 returns leftward as shown in FIG. 9 keeping its level in the low level l. The substrate I is carried to a next process by the unloading belt 42 and a new substrate is carried to an end of the loading belt 41. The drawing nozzle 30 (stylus 33) is lowered so as to draw on the substrate II and pushes it until the substrate holding member 50 is lowered to the level Ho as shown in FIG. 5. Till then the substrate holding member 50 is raised with the stronger force B by the moving coil 60.

After that, the raising force is changed into the weak force S so as to hold the substrate "a" movably in the up and down directions, and the sequential operations returns to a condition shown in FIG. 5.

When the substrate "a" is carried by the loader belt 41 or the unloader one 42, only side edges of the substrate "a" are contacted with these belts. And when the substrate "a" is transferred onto the pallet 43a or 43b, only front and rear edges are touched by these pallets.

In the above-mentioned structure, this embodiment has the following advantages. An inertia of a swinging part consisting of the substrate "a" and the substrate holding member 50 and the moving poles 61 is small since masses of the substrate "a" and the substrate holding member 50 can be smaller than that of the movable part of the conventional drawing head. Therefore, the relative-moving response of the drawing nozzle 30 is drastically improved, and thereby the thickness of the thick film line is kept uniform. Further, the contact force of the stylus 33 of the drawing nozzle 30 on the substrate "a" can be kept under the predetermined constant value regardless of the up and down motions of the substrate holding member 50, thereby to prevent the circuit patterns from flawing.

Furthermore, the substrate holding member 50 is held movably in the up and down directions in the drawing process, while on the other hand the substrate holding member 50 is held stable at the time of location since it is pushed to the top end of the case 63 of FIG. 8 by changing the holding force thereof into higher one. Therefore, the location of the substrate "a" is adjusted smoothly.

Furthermore in this embodiment, when the substrate "a" is carried by the loader belt 41 or the unloader one 42, only side edges of the substrate "a" are contacted with these belts. And when the substrate "a" is transferred onto the pallet 43a or 43b, only front and rear edges are touched by these pallets as shown in FIGS. 5 to 7. And when the circuit pattern is to be made on the substrate "a", only four corners thereof are touched by the suction nozzles 53. That is, nothing but peripheries of the substrate "a" is touched. Therefore, soon after drawing on a surface of the substrate "a" the thick film line C can be drawn on another surface of the already drawn substrate without needs of making a drying and a heating processes. Thereby a thick film drawing apparatus which is suitable for double-face drawing can be provided.

By the way, though the moving coil 60 is adopted in this embodiment as the means for raising the substrate holding member 50 with substantially constant force, such means is not limited to the moving coil. But for instance, an air cylinder which changes the holding force by adjusting air pressure given thereto is applicable.

What is claimed is:

1. Apparatus for drawing thick film circuit patterns on a substrate comprising:

means movable in up and down directions for holding at least one substrate thereon;

means for raising said holding means with a substantially constant first force to locate the substrate in a position for drawing thereon, and with a substantially constant second force weaker than said first force during a drawing process to allow the substrate to move in up and down directions to accommodate unevenness of the surface of the substrate being drawn upon;

means for adjusting the force applied by the raising means;

a drawing head movable in horizontal directions and having a nozzle fixed thereto for emitting paste for drawing directly on a surface of the substrate and having a non-resilient member for contacting said surface of the substrate to resist said second force and to maintain a substantially constant gap between said nozzle and the substrate;

means for locking said drawing head against up and down motions in a drawing process; and adjusting means for locating a substrate into a correct position on said holding means when said holding means is in a raised position for drawing thereon.

2. A thick film drawing apparatus in accordance with claim 1, wherein said raising means are moving coils.

3. The apparatus defined in claim 1 wherein the second force is weaker than a force by which circuit patterns drawn on the substrate are flawed by the contact member.

4. A thick film drawing apparatus in accordance with claim 3, wherein said raising means are moving coils which can change their output forces by changing an exciting voltage or current.

* * * * *